(12) United States Patent
Ryu

(10) Patent No.: US 7,524,751 B2
(45) Date of Patent: Apr. 28, 2009

(54) METHOD FOR FORMING CONTACT HOLE IN SEMICONDUCTOR DEVICE

(75) Inventor: Sang Wook Ryu, Cheongjoo-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 6 days.

(21) Appl. No.: 11/863,471

(22) Filed: Sep. 28, 2007

(65) Prior Publication Data

US 2008/0124876 A1 May 29, 2008

(30) Foreign Application Priority Data

Nov. 29, 2006 (KR) ................ 10-2006-0118696

(51) Int. Cl.
*H01L 21/44* (2006.01)
*H01L 21/4763* (2006.01)
*H01L 21/76* (2006.01)

(52) U.S. Cl. ............ 438/597; 438/607; 438/620; 438/664; 438/424; 438/425; 438/426; 438/429; 438/618; 257/E21.54; 257/E21.507; 257/E21.628

(58) Field of Classification Search ............ 257/E21.54, 257/E21.507, E21.628
See application file for complete search history.

(56) References Cited

U.S. PATENT DOCUMENTS

| 6,235,606 | B1* | 5/2001 | Huang et al. ............ 438/400 |
| 2002/0004282 | A1* | 1/2002 | Hong .................... 438/424 |
| 2005/0164437 | A1* | 7/2005 | Kang et al. ............ 438/197 |
| 2006/0118887 | A1* | 6/2006 | Lee ..................... 257/384 |
| 2007/0148884 | A1* | 6/2007 | Park et al. ............ 438/296 |
| 2007/0148891 | A1* | 6/2007 | Sung .................... 438/353 |
| 2008/0001218 | A1* | 1/2008 | Kim et al. .............. 257/330 |

FOREIGN PATENT DOCUMENTS

KR   10-2003-0079145   5/2005

* cited by examiner

*Primary Examiner*—Walter L Lindsay, Jr.
*Assistant Examiner*—Mohsen Ahmadi
(74) *Attorney, Agent, or Firm*—Saliwanchik, Lloyd & Saliwanchik

(57) ABSTRACT

Methods for forming a contact hole in a semiconductor device are provided. An exposed portion of an isolation layer, which may be generated during a process of forming a borderless contact hole, can be covered with a material similar to that of the substrate.

16 Claims, 3 Drawing Sheets

METHOD FOR FORMING CONTACT HOLE IN SEMICONDUCTOR DEVICE

CROSS-REFERENCE TO RELATED APPLICATION

The present application claims the benefit under 35 U.S.C. §119 of Korean Patent Application No. 10-2006-0118696, filed Nov. 29, 2006, which is hereby incorporated by reference in its entirety.

BACKGROUND

As semiconductor devices become highly integrated, the width of gate lines has been reduced and copper interconnection processes have been used. When using a contact hole to connect a source/ drain area and a gate to an interconnection, high integration and high performance are typically achieved by using a borderless contact technology.

Additionally, the area occupied by each unit device in a semiconductor device has been decreasing, as has the area in which a contact is formed. Therefore, contact resistance is often increased and a contact process margin is not easily ensured.

A metal-silicide layer is generally applied to a contact part in order to compensate for the increase in contact resistance, and a Borderless Contact (BLC) is applied in order to ensure a contact process margin.

As the line width of semiconductor devices has become smaller, contacts for interconnection among unit transistor devices have often been formed using a BLC method in which the contacts are directly formed in a source area or a drain area of a transistor without separately providing areas to form the contacts. Accordingly, the size of a chip can be further reduced, Since the borderless contact hole of a semiconductor device exists in both an active region and an isolation layer, the line width of the semiconductor device can be reduced.

However, if the isolation layer is partially over-etched when the borderless contact hole is formed, junction leakage current often occurs.

This leads to the contact area between the borderless contact hole and an active area being decreased, which leads to an increase in the contact resistance.

Additionally, in highly integrated semiconductor devices, borderless contact technology often interferes with a source/drain region and an isolation region. In particular, junction portions are frequently damaged when a contact hole is formed to make contact with a source/drain region.

Thus, there exists a need in the art for an improved method of forming a contact hole in a semiconductor device.

BRIEF SUMMARY

Embodiments of the present invention provide methods for forming a contact hole in a semiconductor device. The present invention can improve reliability of a semiconductor device by inhibiting a junction bridge when a contact is formed while forming a borderless contact hole.

An isolation layer can be formed on a semiconductor substrate to define an active region and a field region, and a gate oxide layer, a gate, a sidewall spacer, and a source/drain area can be formed on the active region. A silicide layer, a borderless nitride layer, and an interlayer dielectric layer can be formed on the semiconductor substrate, and a contact hole simultaneously exposing the source/drain area and the isolation layer can be formed. A penetration area can be filled by forming a silicon compensation part through a process such as Selective Epitaxial Growth (SEG).

In an embodiment, the penetration area can be filled by forming a silicon layer by using Chemical Vapor Deposition (CVD) and then forming a silicon compensation part by etching the silicon layer.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
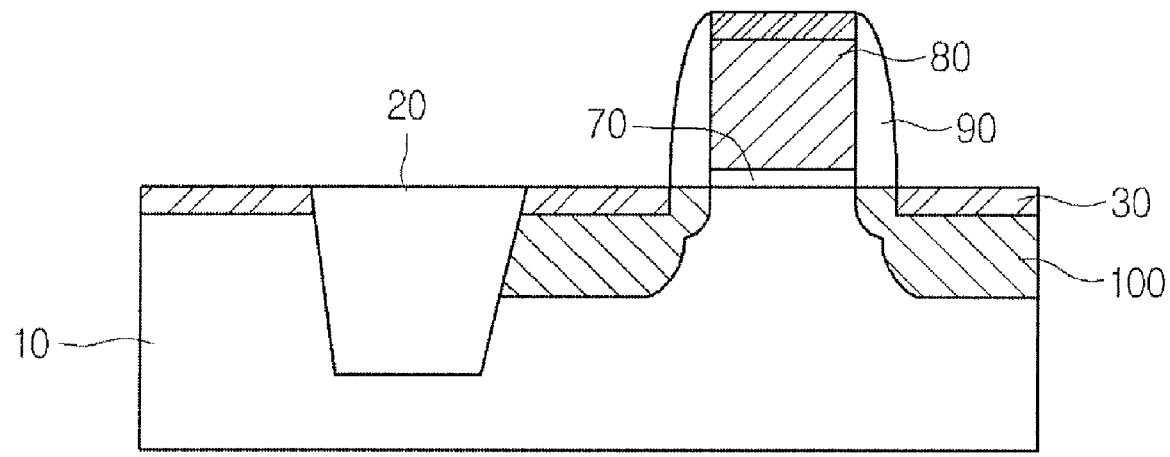
FIGS. 1 to 5 are cross-sectional views showing a method for forming a contact hole in a semiconductor device according to an embodiment of the present invention.

Referring to FIG. 1, an isolation layer 20 can be formed on a semiconductor substrate 10 to define an active region and a field region on the semiconductor substrate 10. The isolation layer 20 can be formed through a Shallow Trench Isolation (STI) process.

The semiconductor substrate 10 can be, for example, a single crystalline silicon substrate or a substrate doped with P- or N-type impurities.

In an embodiment, the isolation layer 20 can be formed by first forming a pad oxide layer and a mask layer on the semiconductor substrate 10, such that the field region is exposed. Then, a trench can be formed by etching the exposed portion of the semiconductor substrate 10. Next, the trench can be filled with an oxide, and the mask layer and the pad oxide layer can be removed, such that the isolation layer 20 can be formed.

A gate oxide layer can be formed on the substrate 10, and then polysilicon can be deposited on the gate oxide layer and doped with impurities. A gate insulating layer 70 and a gate 80 can be formed through an etching process.

Dopants can be implanted into the exposed portion of the semiconductor substrate 10 by using the gate 80 as a mask, thereby forming a low density area used as a Lightly Doped Drain (LDD) area.

An insulating layer can then be deposited on the semiconductor substrate 10, and the entire surface of the insulating layer can be etched to form a sidewall spacer 90 making contact with both sides of the gate 80.

Then, a source/drain area 100 can be formed through ion implantation of high density dopants using the gate 80 and the spacer 90 as a mask. Furthermore, a junction can be formed by performing heat treatment for activation of the dopants implanted into the source/drain area 100.

A metal layer can be deposited on the gate 80 and the source/drain area 100 to form a silicide layer 30. The metal layer can include any appropriate material known in the art, for example, cobalt, nickel, or both. The silicide layer 30 can be formed on the active region, thereby reducing electrical resistance when interconnections are formed.

Figure 2:
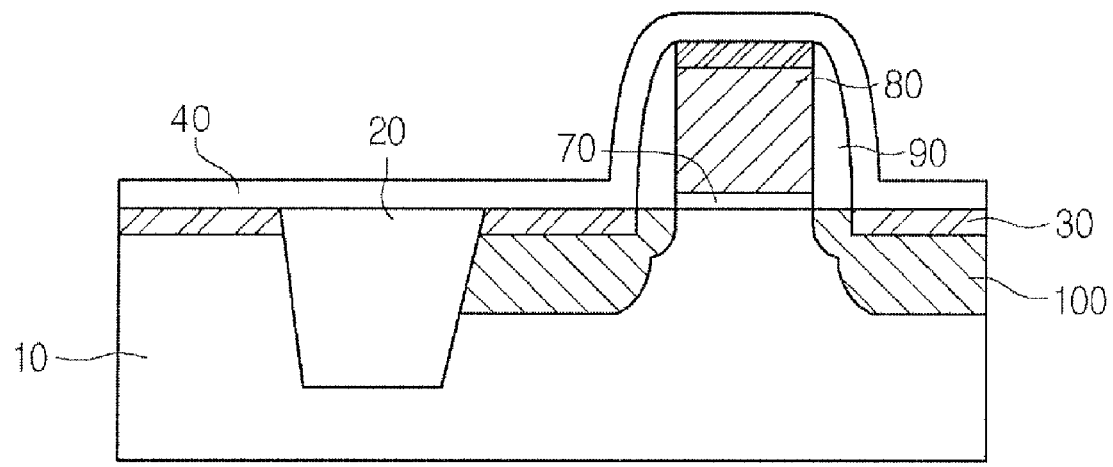

Referring to FIG. 2, a nitride layer 40 having, for example, a thickness of about 150 Å to about 800 Å can be formed on the semiconductor substrate 10.

Figure 3:
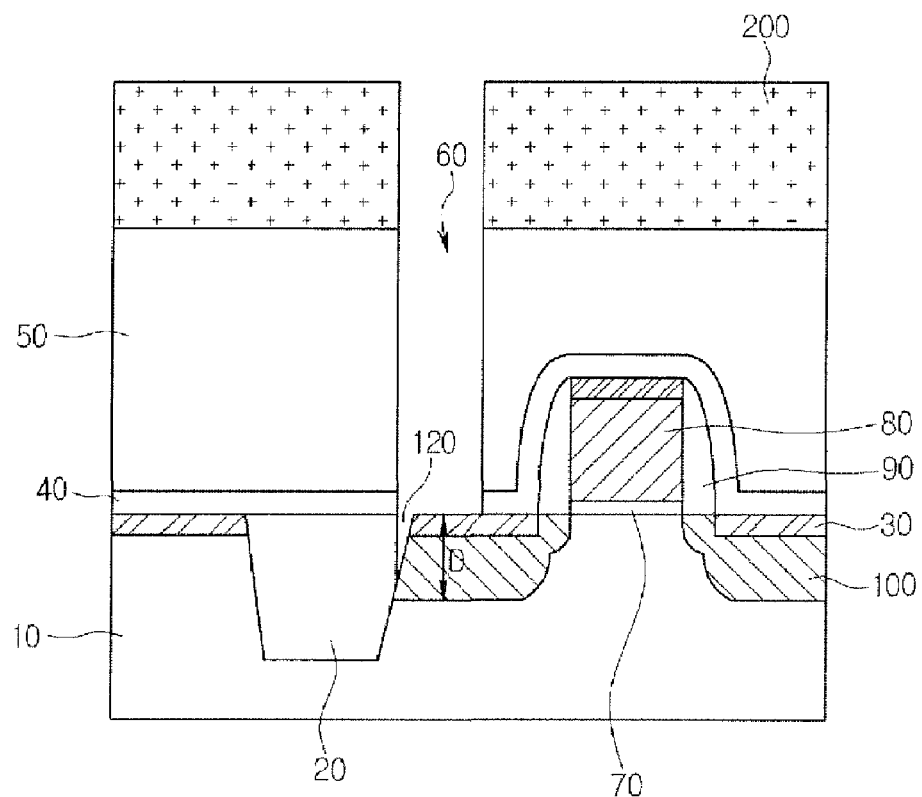

Referring to FIG. 3, an interlayer dielectric layer 50 can be formed on the nitride layer 40. For example, the interlayer dielectric layer 50 can be formed by depositing and planarizing Phosphorus Silicate Glass (PSG), Boron Phosphorus Silicate Glass (BPSG), plasma-enhanced tetra ethyl oxysilane (PE-TEOS), or any combination thereof.

A photoresist material can be coated on the interlayer dielectric layer 50, and an exposure and development process can be performed using a mask, which can define a borderless contact, thereby forming a photoresist pattern 200 that selectively covers the surface of the interlayer dielectric layer 50.

Then, the borderless contact hole 60 can be formed using the photoresist pattern 200 as a mask. In an embodiment, the borderless contact hole 60 can be formed through a dry etching process using plasma activated by a combination of main etching gases and additional gases. For example, the main etching gases can be $C_xH_yF_z$ (where x, y, and z are each, independently, 0 or a positive integer), and the additional gases can be $O_2$, $N_2$, Ar, He, or any combination thereof.

Then, the photoresist pattern 200 can be removed through an ashing process.

The borderless contact hole 60 can exist exposing both the active region and the isolation layer 20.

Referring again to FIG. 3, the nitride layer 40 may be over-etched, and the isolation layer 20 may be partially etched up to the junction depth D. Therefore, a penetration region 120 exposing a part of the isolation layer 20 at a bottom portion of the contact hole 60 may be formed. This penetration region 120 could potentially lead to junction leakage current.

Figure 4:
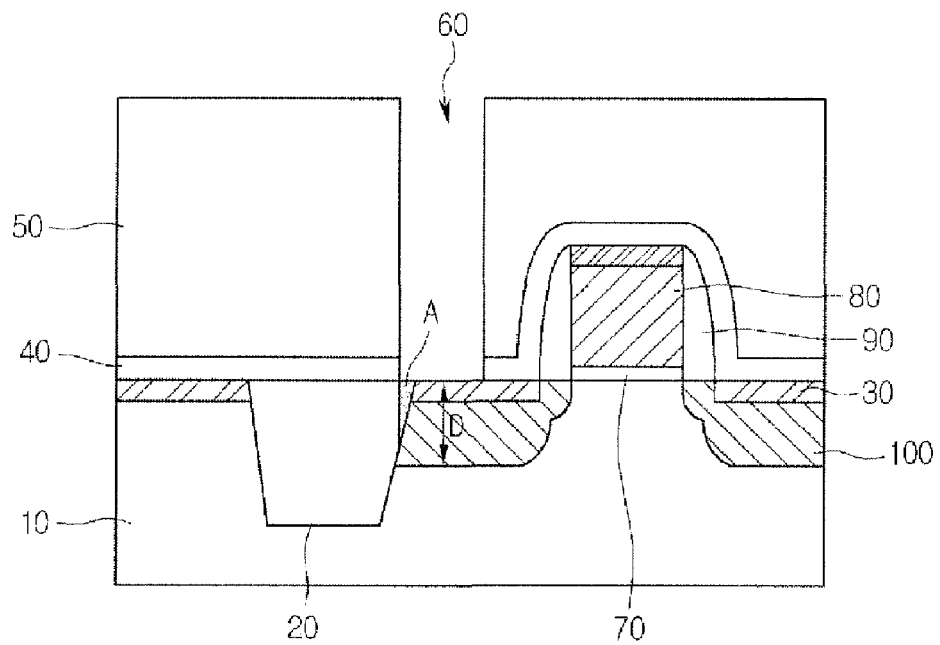

Referring to FIG. 4, silicon can be filled in the penetration region 120 through a deposition process, such as a Selective Epitaxial Growth (SEG) method.

In a SEG method, in an environment in which the semiconductor substrate 10 is exposed, source gases can be fed onto the semiconductor substrate 10 to form a material layer having a single crystalline structure similar to that of the semiconductor substrate 10. Thus, when forming a contact the source/drain area of the substrate 10, can be thickened to inhibit current leakage and the possibility of short-circuiting at the contact.

Accordingly, a compensation deposition process can be performed on the semiconductor substrate 10, which is exposed near the bottom of the contact hole 60. The compensation deposition process can be a SEG process. For example, the compensation deposition process can use material similar to that of the semiconductor substrate 10, such as silicon (Si), germanium (Ge), or Si—Ge. A silicon layer can be formed in the penetration region 120 of the semiconductor substrate 10, thereby forming a silicon compensation part A.

In an embodiment, the silicon deposition in a SEG process can be performed using $S_xH_y$ or $S_xH_yC_z$ gases (where x, y, and z are each, independently zero or a positive integer) at a pressure of about 10 Torr to about 200 Torr and a temperature of about 600° C. to about 900° C. For example, $SiH_4$, $Si_2H_6$, or $Si_2H_2C_{12}$ can be provided at a rate of about 10 standard cubic centimeters per minute (SCCM) to about 1,000 SCCM to grow a material layer, having similar properties to the silicon layer, on the silicon layer of the semiconductor substrate 10, thereby forming the silicon compensation part A.

Accordingly, the penetration region 120 can be covered, increasing the surface area of the active region.

Figure 5:
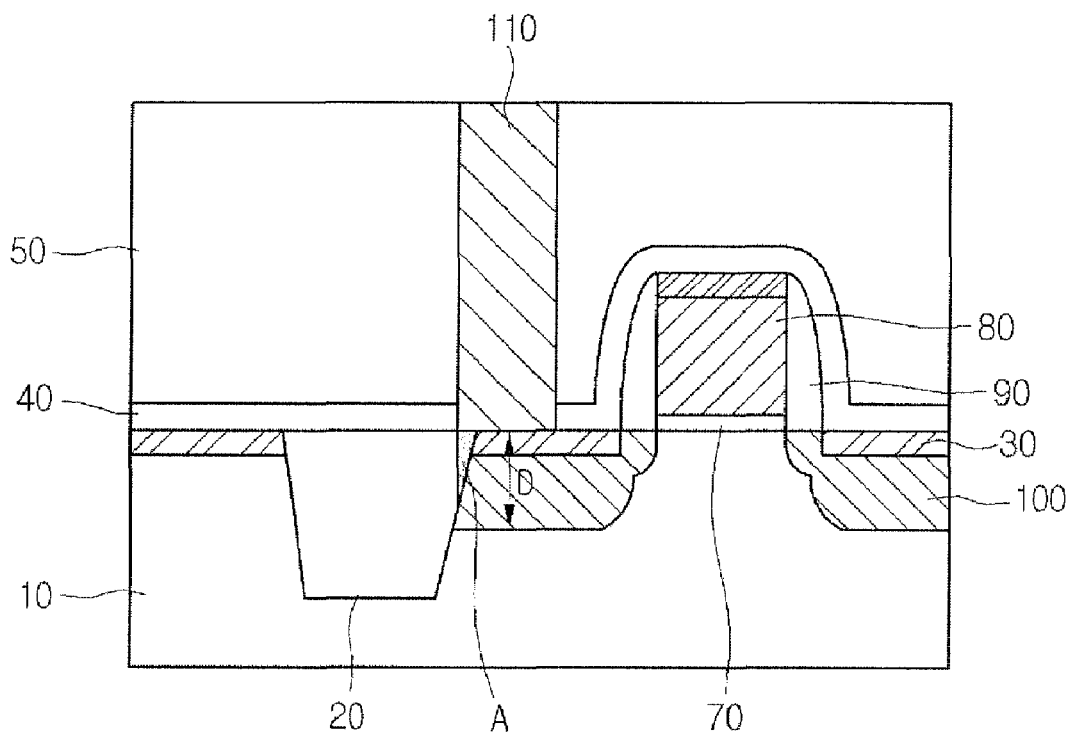

Referring to FIG. 5, a plug 110 can be formed by filling the contact hole 60 with conductive material, such as tungsten (W). The plug 110 can be protected from junction penetration by the silicon compensation part A, thereby preventing junction leakage current.

Figure 6:
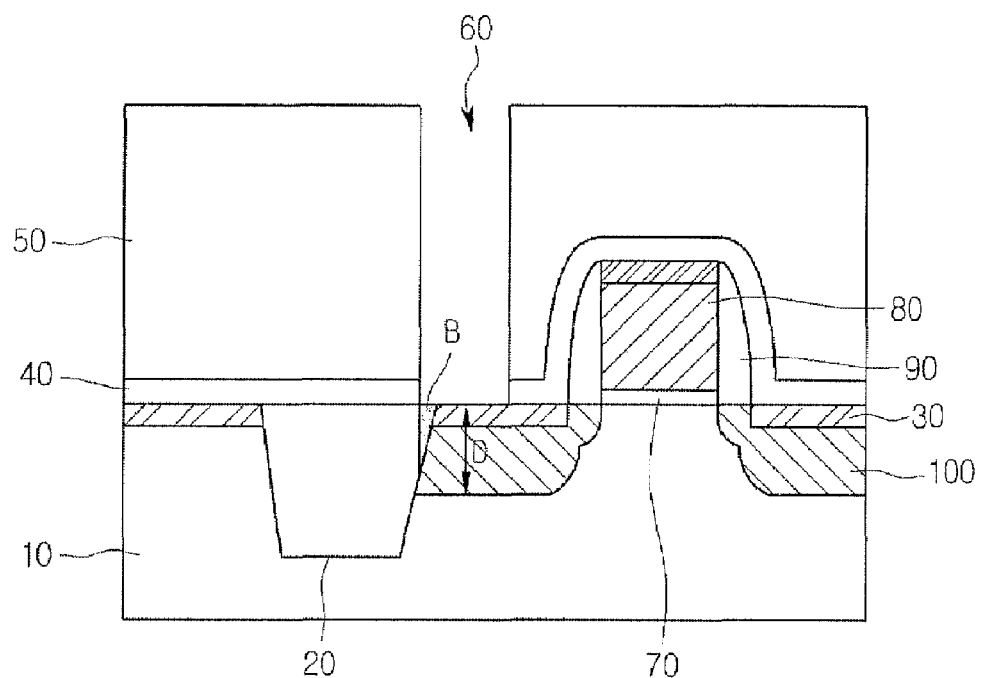
FIG. 6 is a cross-sectional view showing a method for forming a contact hole in a semiconductor device according to an embodiment of the present invention.

FIG. 6 is a cross-sectional view showing a method for forming a contact hole in a semiconductor device according to an embodiment of the present invention.

As described above, the nitride layer 40 may be over-etched, leading to the formation of the penetration region 120. A compensation part B can be formed in the penetration region 120 of the semiconductor substrate 10 by using a Chemical Vapor Deposition (CVD) method. For example, material such as Si, Ge, or Si—Ge can be deposited to form a silicon layer, and then the entire surface of the silicon layer can be etched to form silicon compensation part B in the penetration region 120. Thus, the surface area of the active region can be increased.

According to embodiments of the present invention, when forming a contact hole in a semiconductor device, an exposed part of the isolation layer, which may be over-etched while forming a borderless contact hole, can be covered with material similar to that of the semiconductor substrate. A compensation deposition process can be performed to cover the exposed portion of the isolation layer, leading to an active region having an increased surface, thereby reducing contact resistance of a semiconductor device.

Moreover, junction leakage current that may be generated in the vicinity of the contact hole can be inhibited.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for forming a contact hole in a semiconductor device, comprising:
    forming an isolation layer in a semiconductor substrate to define an active region and a field region;
    forming a contact hole exposing at least a portion of the active region and at least a portion of the isolation layer; and
    forming a silicon compensation part at an over-etched portion of the isolation layer, wherein the silicon compensation part covers the over-etched portion of the isolation layer; wherein forming the silicon compensation part comprises using a Selective Epitaxial Growth (SEG) method.

2. The method according to claim 1, wherein the SEG method comprises the use of silicon (Si), germaniuim (Ge), or Si—Ge.

3. The method according to claim 1, wherein the SEG method comprises using $S_xH_yC_z$ gas at a rate of about 10 SCCM to about 1,000 SCCM at a pressure of about 10 Torr to about 200 Torr and at a temperature of about 600° C. to about 900° C., where x is a positive integer, y is a positive integer, and z is 0 or a positive integer.

4. The method according to claim 3, wherein x is 1, y is 4, and z is 0.

5. The method according to claim 3, wherein x is 2, y is 6, and z is 0.

6. The method according to claim 3, wherein x is 1, y is 2, and z is 12.

7. The method according to claim 1, wherein the at least a portion of the active region comprises a source area.

8. The method according to claim 1, wherein the at least a portion of the active region comprises a drain area.

9. The method according to claim 1, further comprising forming a nitride layer and an interlayer dielectric layer on the semiconductor substrate, wherein forming a contact hole comprises performing a dry etching process with respect to the interlayer dielectric layer and the nitride layer.

10. The method according to claim 9, wherein the dry etching process uses at least one etching gas and at least one additional gas, and wherein the at least one additional gas is oxygen ($O_2$), nitrogen ($N_2$), argon (Ar), or helium (He), and wherein the at least one etching gas is $C_xH_yF_z$, where x is a positive integer, y is a positive integer, and z is a positive integer.

11. The method according to claim 1, further comprising forming a silicide layer on the semiconductor substrate.

12. The method according to claim 11, further comprising:
    forming a gate oxide layer, a gate, and a sidewall spacer on the active region;
    forming a source/drain area on the active region;
    forming a silicide layer on the source/drain area;
    forming a nitride layer on the semiconductor substrate including the silicide layer, the isolation layer, the gate, and the sidewall spacer, and
    forming an interlayer dielectric layer on the nitride layer.

13. The method according to the claim 12, wherein the nitride layer has a thickness of about 150 Å to about 800 Å.

14. The method according to claim 12, wherein the interlayer dielectric layer comprises Phosphorus Silicate Glass (PSG), Boron Phosphorus Silicate Glass (BPSG), or plasma-enhanced tetra ethyl oxysilane (PE-TEOS).

15. A method forming a contact hole in a semiconductor device, comprising:
    forming an isolation layer in a semiconductor substrate to define an active region and a field region;
    forming a contact hole exposing at least a portion of the active region and at least a portion of the isolation layer; and
    forming a silicon compensation part at an over-etched portion of the isolation layer,
    wherein the silicon compensation part covers the over-etched portion of the isolation layer;
    wherein forming the silicon compensation part comprises:
        forming a silicon layer by using a Chemical Vapor Deposition (CVD) method; and
        etching the silicon layer to form the silicon compensation part.

16. The method according to claim 15, wherein forming a silicon layer comprises the use of Si, Ge, or Si—Ge.

* * * * *